United States Patent [19]

Yen et al.

[11] Patent Number: 5,543,656
[45] Date of Patent: Aug. 6, 1996

[54] METAL TO METAL ANTIFUSE

[75] Inventors: Yeouchung Yen, San Jose; Shih-Oh Chen, Los Altos, both of Calif.

[73] Assignee: Actel Corporation, Sunnyvale, Calif.

[21] Appl. No.: 328,247

[22] Filed: Oct. 24, 1994

Related U.S. Application Data

[63] Continuation-in-part of Ser. No. 319,170, Oct. 6, 1994, and Ser. No. 284,054, Aug. 1, 1994, which is a continuation-in-part of Ser. No. 790,366, Nov. 12, 1991, Pat. No. 5,404,029, Ser. No. 947,275, Sep. 18, 1992, Pat. No. 5,387,812, Ser. No. 4,912, Jan. 19, 1993, Pat. No. 5,411,917, Ser. No. 50,744, Apr. 20, 1993, abandoned, Ser. No. 172,132, Dec. 21, 1993, Pat. No. 5,381,035, Ser. No. 197,102, Feb. 15, 1994, abandoned, and Ser. No. 231,634, Apr. 22, 1994, which is a continuation-in-part of Ser. No. 4,912, Jan. 19, 1993, which is a continuation-in-part of Ser. No. 604,779, Oct. 26, 1990, Pat. No. 5,181,096, which is a continuation-in-part of Ser. No. 508,306, Apr. 12, 1990, Pat. No. 5,072,384, said Ser. No. 947,275, is a division of Ser. No. 743,261, Aug. 9, 1991, Pat. No. 5,272,101, which is a division of Ser. No. 604,779, said Ser. No. 50,744, is a continuation of Ser. No. 749,866, Aug. 26, 1991, abandoned, said Ser. No. 172,132, is a continuation-in-part of Ser. No. 950,264, Sep. 23, 1992, abandoned, said Ser. No. 197,102, is a continuation of Ser. No. 950,264, said Ser. No. 231,634, is a continuation-in-part of Ser. No. 4,912, which is a continuation-in-part of Ser. No. 604,779.

[51] Int. Cl.$^6$ ............................ H07L 23/48; H07L 29/46; H07L 27/02; H07L 29/62
[52] U.S. Cl. .................... 257/530; 257/50; 257/751; 257/767
[58] Field of Search ............................. 257/50, 530, 767, 257/751

[56] References Cited

U.S. PATENT DOCUMENTS

| | | | |
|---|---|---|---|
| 4,561,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchowski | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |

(List continued on next page.)

FOREIGN PATENT DOCUMENTS

| | | |
|---|---|---|
| 8700969 | 7/1986 | European Pat. Off. |
| 8702827 | 10/1986 | European Pat. Off. |
| 0162529 | 3/1989 | European Pat. Off. |
| 0323078 | 7/1989 | European Pat. Off. |
| 0455414 | 4/1991 | European Pat. Off. |
| 0452091 | 10/1991 | European Pat. Off. |
| 9213359 | 1/1992 | European Pat. Off. |

(List continued on next page.)

OTHER PUBLICATIONS

Chapman et al., "A Lazer Linking Process for Restructurable VLSI", Cleo '82, Apr. 14–16, 1982, Phoenix, Arizona.
Burns, G. P. "Titanium dioxide formed by rapid thermal oxidation" Nov. 4, 1988 Journal of Applied Science, pp. 2095–2097.
Pauleau, "Interconnect Materials for VLSI Circuits", Apr. 1987 Solid State Technology, pp. 155–162.

*Primary Examiner*—Robert P. Limanek
*Assistant Examiner*—David B. Hardy
*Attorney, Agent, or Firm*—D'Alessandro & Ritchie

[57] ABSTRACT

The antifuse structure of the present invention includes a bottom planarized electrode, an ILD disposed over the bottom electrode, an antifuse cell opening in and through the ILD exposing the bottom electrode, a first barrier metal layer disposed by means of collimated sputter deposition in the antifuse cell opening to form a layer of uniform thickness existing only within the antifuse cell opening in order to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer and optionally formed by collimated sputter deposition, and a top electrode disposed over the second barrier metal layer.

4 Claims, 5 Drawing Sheets

U.S. PATENT DOCUMENTS

| | | | |
|---|---|---|---|
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/530 |
| 5,194,759 | 3/1993 | El-Ayat et al. | 357/202.1 |
| 5,196,724 | 3/1993 | Gordon et al. | 257/530 |
| 5,233,217 | 8/1993 | Dixit et al. | 257/530 |
| 5,248,632 | 9/1993 | Tung et al. | 437/195 |
| 5,258,643 | 11/1993 | Cohen | 257/530 |
| 5,266,829 | 11/1993 | Hamdy et al. | 257/530 |
| 5,272,101 | 12/1993 | Forouhi et al. | 437/44 |
| 5,272,666 | 12/1993 | Tsang et al. | 257/530 |
| 5,284,788 | 2/1994 | Spratt et al. | 437/52 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |
| 5,329,153 | 7/1994 | Dixit | 257/529 |
| 5,353,246 | 10/1994 | Tsang et al. | 365/96 |
| 5,373,169 | 12/1994 | McCollum et al. | 257/530 |
| 5,404,029 | 4/1995 | Husher et al. | 257/50 |

FOREIGN PATENT DOCUMENTS

| | | |
|---|---|---|
| 9220109 | 4/1992 | European Pat. Off. . |
| 9303499 | 7/1992 | European Pat. Off. . |
| 3927033 | 8/1989 | Germany . |
| 59-098971 | 12/1985 | Japan . |

METAL TO METAL ANTIFUSE

CROSS-REFERENCES TO RELATED APPLICATIONS

This application is a continuation-in-part of: (1) copending U.S. patent application Ser. No. 08/284,054 entitled "METAL-TO-METAL ANTIFUSES INCORPORATING VIA PLUG AND METHODS OF MAKING SAME", filed Aug. 1, 1994, in the name of inventors Abdul R. Forouhi, Frank W. Hawley, John L. McCollum and Yeouchung Yen, which is a continuation-in-part of: U.S. patent application Ser. No. 07/790,366, now U.S. Pat. No. 5,404,029, entitled "Electrically Programmable Antifuse Element", filed Nov. 12, 1991, in the name of inventors John D. Husher and Abdul R. Forouhi, of which U.S. patent application Ser. No. 07/888,042 entitled "Electrically Programmable Antifuse Element", filed May 22, 1992, in the name of inventors John D. Husher and Abdul R. Forouhi, now U.S. Pat. No. 5,171,715, is a divisional; U.S. patent application Ser. No. 07/947,275 entitled "Metal-to-Metal Antifuse Structure", filed Sep. 18, 1992, in the name of inventors Abdul R. Forouhi, Esmat Z. Hamdy, Chenming Hu and John L. McCollum, now U.S. Pat. No. 5,387,812 which is a divisional of U.S. patent application Ser. No. 07/743,261 entitled "Electrically Programmable Antifuse and Fabrication Processes", filed Aug. 9, 1991, in the name of inventors Abdul R. Forouhi, Esmat Z. Hamdy, Chenming Hu, and John L. McCollum, now U.S. Pat. No. 5,272,101, which is a continuation-in-part of U.S. patent application Ser. No. 07/604,779 entitled "Electrically Programmable Antifuse Incorporating Dielectric and Amorphous Silicon Interlayer", filed Oct. 26, 1990, in the name of inventors Abdul R. Forouhi, John L. McCollum and Shih-Oh Chen, now U.S. Pat. No. 5,181,096, which is a continuation-in-part of U.S. patent application Ser. No. 07/508,306 entitled "Electrically Programmable Antifuse Element Incorporating A Dielectric and Amorphous Silicon Interlayer", filed Apr. 12, 1990, in the name of inventors John L. McCollum and Shih-Oh Chen, now U.S. Pat. No. 5,072,384; U.S. patent application Ser. No. 08/172,132 entitled "Metal-to-Metal Antifuse Including Etch Stop Layer", filed Dec. 21, 1993, in the name of inventors Wenn-Jei Chen, Steve S. Chiang and Frank W. Hawley, now U.S. Pat. No. 5,381,035, which is a continuation-in-part of U.S. patent application Ser. No. 07/950,264 entitled "Antifuse Element and Fabrication Method", filed Sep. 23, 1992 in the name of inventor Frank W. Hawley, now abandoned, of which U.S. patent application Ser. No. 08/197,102 entitled "Antifuse Element and Fabrication Method", filed Feb. 15, 1994, in the name of inventor Frank W. Hawley, now abandoned, is a continuation; U.S. patent application Ser. No. 08/197,102, referred to above; U.S. patent application Ser. No. 08/050,744 entitled "Elevated Metal-to-Metal Antifuse Structures and Fabrication Processes", filed Apr. 20, 1993, in the name of inventors Frank W. Hawley and John L. McCollum, now abandoned, which is a continuation of U.S. patent application Ser. No. 07/749,866 entitled "Elevated Metal-to-Metal Antifuse Structures and Fabrication Processes", filed Aug. 26, 1991, in the name of inventors Frank W. Hawley and John L. McCollum, now abandoned, of which U.S. patent application Ser. No. 07/900,651 entitled "Elevated Metal-to-Metal Antifuse Structures and Fabrication Processes", filed June 18, 1992, in the name of inventors Frank W. Hawley and John L. McCollum, now abandoned, is a divisional; U.S. patent application Ser. No. 08/231,634 entitled "Electrically Programmable Antifuse Incorporating Dielectric and Amorphous Silicon Interlayers", filed Apr. 22, 1994, in the name of inventors John L. McCollum, Eltoukhy Abdelshafy and Abdul R. Forouhi, now pending, which is a continuation-in-part of U.S. patent application Ser. No. 08/004,912 entitled "Electrically Programmable Antifuse Incorporating Dielectric and Amorphous Silicon Interlayer", filed Jan. 19, 1993, in the name of inventors Abdul R. Forouhi, John L. McCollum and Shih-Oh Chen, now U.S. Pat. No. 5,411,917, which is a continuation-in-part of U.S. patent application Ser. No. 07/604,779, referred to above; and U.S. patent application Ser. No. 08/004,912, referred to above. and (2) co-pending U.S. patent application Ser. No. 08/319,170 entitled "METAL TO METAL ANTIFUSE", filed Oct. 6, 1994, in the name of inventors Yeouchung Yen, Shih-Oh Chen, Leuh Fang, Elaine T. Poon and James B. Kruger. The entirety of the above-identified patent applications is hereby incorporated herein by reference as if set forth fully herein.

BACKGROUND OF THE INVENTION

1. Field of the Invention

The present invention is directed to a metal-to-metal antifuse structure for use in microcircuit structures such as Field Programmable Gate Arrays (FPGAs) and the like. More particularly, the antifuse structure of the present invention comprises an antifuse cell opening in which is deposited a barrier metal by means of collimated sputtering deposition over which is deposited the antifuse material layer and then another barrier metal layer. The resulting structure is advantageous in that it can be fabricated with standard CMOS process techniques plus the addition of collimated sputtering and it provides a device having a low capacitance antifuse operable at higher speeds.

2. The Prior Art

Prior art metal-to-metal antifuse structures generally comprise a planar bottom electrode on top of which is disposed a planar barrier metal layer. An interlayer dielectric layer (ILD) is disposed over the bottom electrode structure and an antifuse cell opening is formed in the ILD to expose the bottom electrode. An antifuse material layer may then be deposited in the antifuse cell opening (or "via") and appropriate layers deposited over the antifuse material layer. The problem with this approach is that it requires a thicker barrier layer on top of the bottom electrode which is not a standard process in CMOS backend technology. For manufacturability, it is desirable to have antifuse related processes impose as little change as possible on the process technology.

OBJECTS AND ADVANTAGES OF THE INVENTION

Accordingly, it is an object of the present invention to provide a metal-to-metal antifuse structure maximizing the use of standard process steps and therefore resulting in increased manufacturability.

It is a further object of the present invention to provide a metal-to-metal antifuse having a better step coverage for the top electrode disposed within the antifuse cell opening and deposited by means of collimated sputtering.

These and many other objects and advantages of the present invention will become apparent to those of ordinary skill in the art from a consideration of the drawings and ensuing description of the invention.

SUMMARY OF THE INVENTION

The antifuse structure of the present invention includes a bottom planarized electrode, an ILD disposed over the bottom electrode, an antifuse cell opening in and through the ILD exposing the bottom electrode, a first barrier metal layer disposed by means of collimated sputter deposition in the antifuse cell opening to form a layer of uniform thickness existing only within the antifuse cell opening in order to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer and optionally formed by collimated sputter deposition, and a top electrode disposed over the second barrier metal layer.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to an improved metal-to-metal antifuse structure utilizing collimated sputter deposition to form at least the first barrier layer which provides an easily manufactured device using standard CMOS process steps in addition to collimated sputter deposition. An advantage of the novel structure is reduced capacitance with reduced capacitance over prior art metal-to-metal antifuse structures.

Figure 1:
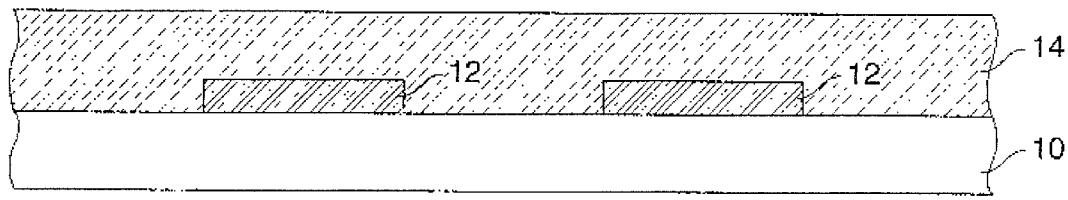
FIGS. 1–9 are diagrams showing progressive stages of construction of the metal-to-metal antifuse structure according to the present invention.
Figure 2:
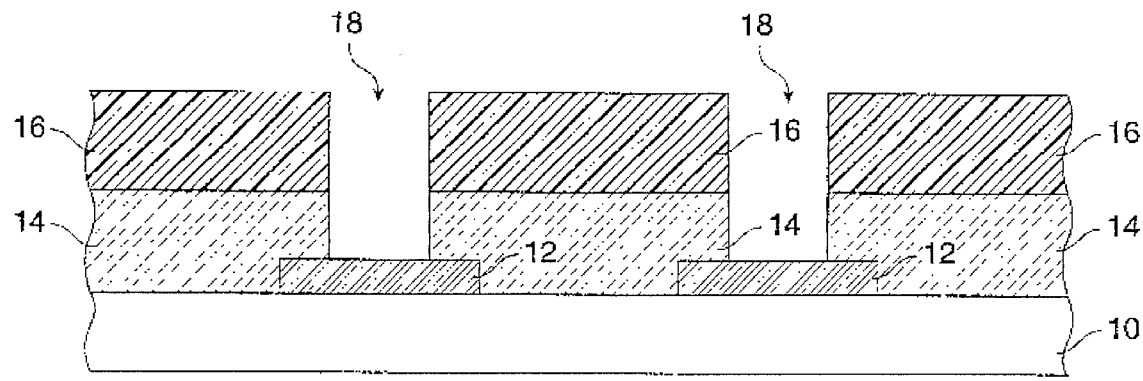
Figure 3:
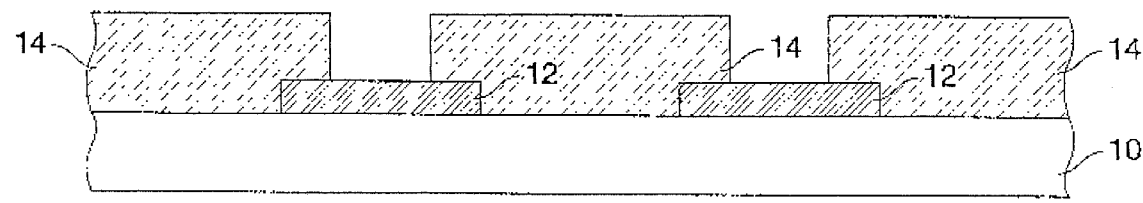
Figure 4:
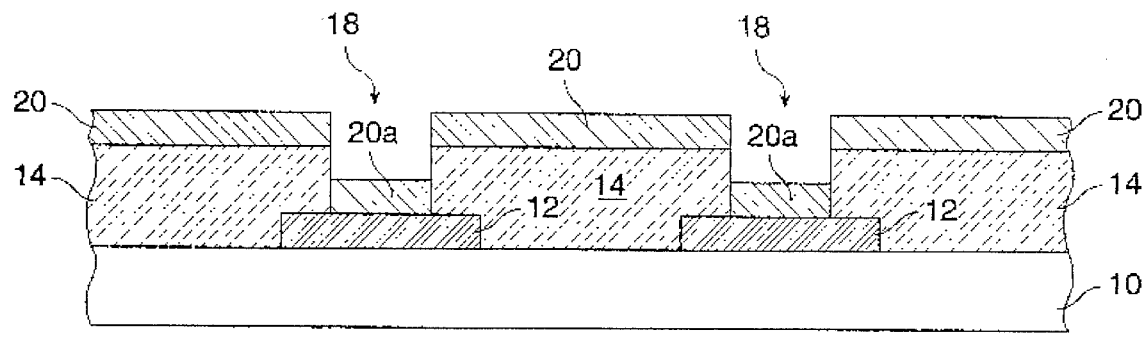

Turning to the drawings, FIG. 1 depicts a substrate 10 on which has been formed a pair of bottom electrodes 12 which will form the bottom antifuse electrode. The substrate 10 may be any insulating portion of a microcircuit or semiconductor structure. Bottom electrodes 12 are preferably aluminum of thickness in the range of 3000 Å–10000 Å with 5000 Å presently preferred. Bottom electrodes 12 can also be any standard metallization compatible with standard CMOS processes. As shown in FIG. 1, over bottom electrodes 12 is formed an interlayer dielectric layer (ILD) 14 preferably of oxide of thickness in the range of 3000 Å–10000 Å with 5000 Å, presently preferred. As can be seen in FIG. 2, resist layer 16 is applied in a conventional way and antifuse cell openings 18 are opened using conventional etching techniques through ILD 14 to expose bottom electrodes 12 as shown. FIG. 3 shows the structure after stripping the resist layer 16. As shown in FIG. 4, a first barrier metal layer 20/20a is formed by collimated sputter deposition of a barrier metal material such as tungsten (W), titanium-tungsten (TiW), titanium-tungsten nitride (TiWN), titanium nitride (TIN), titanium (Ti), tungsten silicide (WSix), and combinations of the foregoing. Preferably barrier metal layer 20/20a is formed of TiN of thickness in the range of 1000 Å–3000 Å with 2000 Å presently preferred. As can be seen in FIG. 4, barrier metal layer 20 is disposed over ILD 14 and barrier metal layer 20a is disposed directly over and in contact with bottom electrodes 12 within antifuse cell openings 18.

Figure 5:
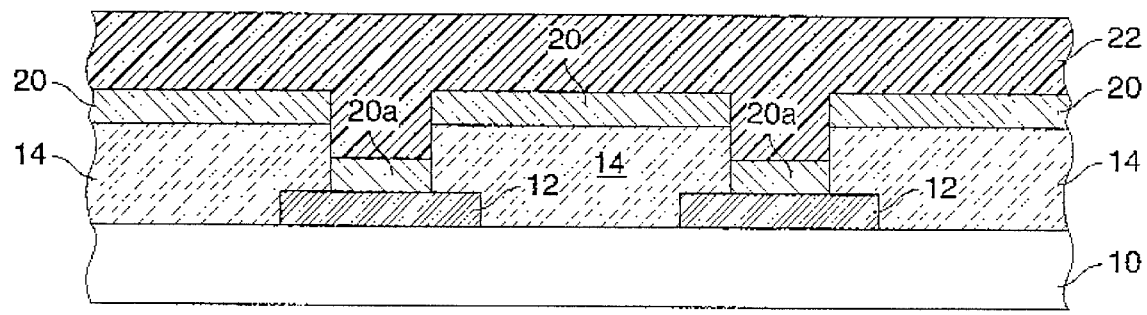
Figure 6:
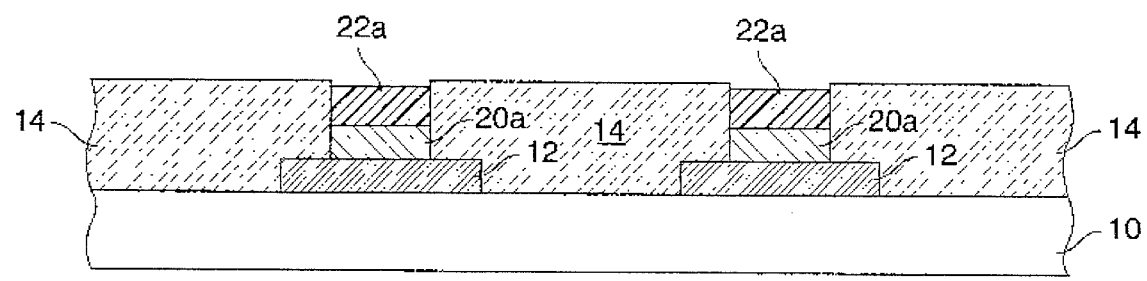
Figure 7:
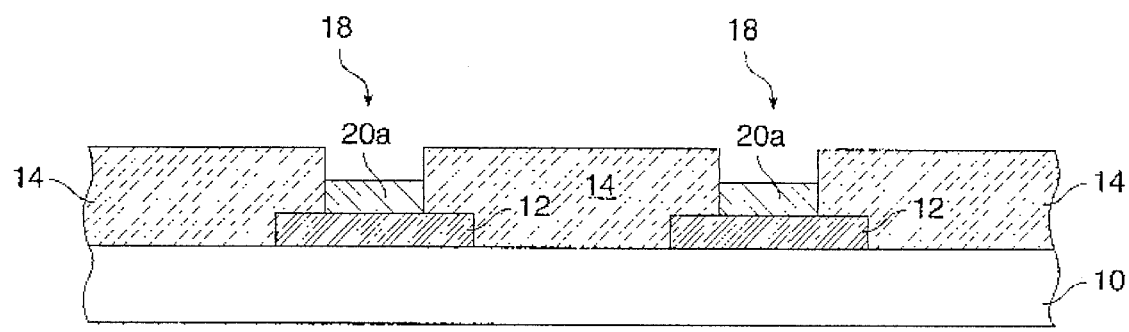

As shown in FIG. 5, a photoresist layer 22 of thickness in the range of 0.4–0.7 μm is spun on and then uniformly blanket etched back until ILD 14 is exposed to yield the structure of FIG. 6. Then the resist layer 22a remaining (FIG. 6) is stripped using conventional resist stripping techniques to yield the result shown in FIG. 7—a flat barrier metal layer 20a (Via 18 is preferably round when looking down on it).

Figure 8:
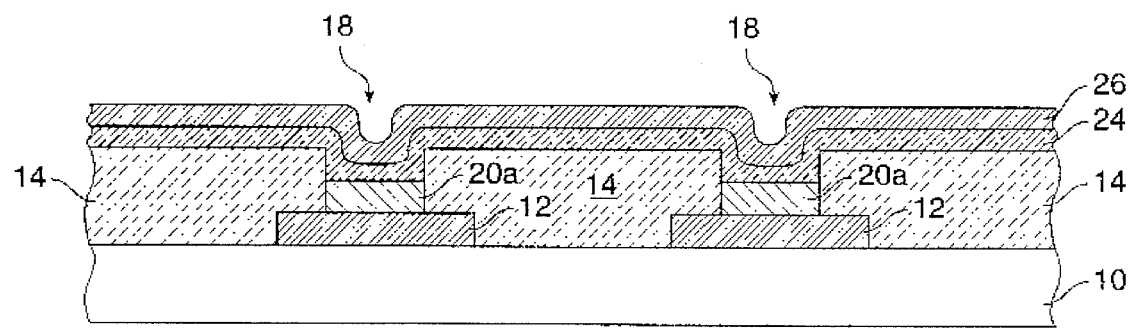

Next, as shown in FIG. 8, antifuse material layer 24 is deposited over first barrier metal layer 20a. Antifuse material layer 24 is preferably formed of a conventional nitride-amorphous silicon-nitride sandwich where the first (lower) nitride layer is preferably of thickness in the range of 70 Å–200 Å with 100 Å presently preferred; the amorphous silicon layer is preferably of thickness in the range of 300 Å–1000 Å with 500 Å presently preferred; and the second (upper) nitride layer is preferably of thickness in the range of 70 Å–200 Å with 100 Å presently preferred. Over antifuse material layer 24 is preferably deposited second barrier metal layer 26 which is preferably formed either by collimated sputter deposition or by a blanket deposit of a barrier metal material such as W, TiW, TiWN, TiN, Ti, WSix, and combinations of the foregoing. Preferably second barrier metal layer 26 is formed of TiN of thickness in the range of 1000 Å–3000 Å with 2000 Å presently preferred.

Figure 9:
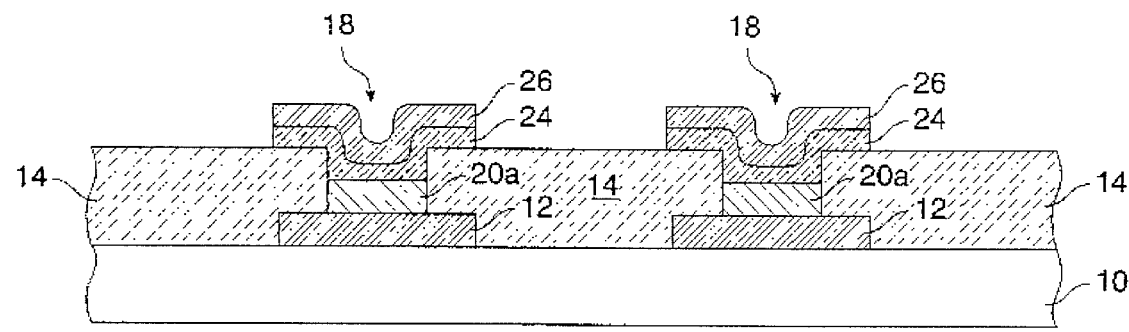
Figure 10:
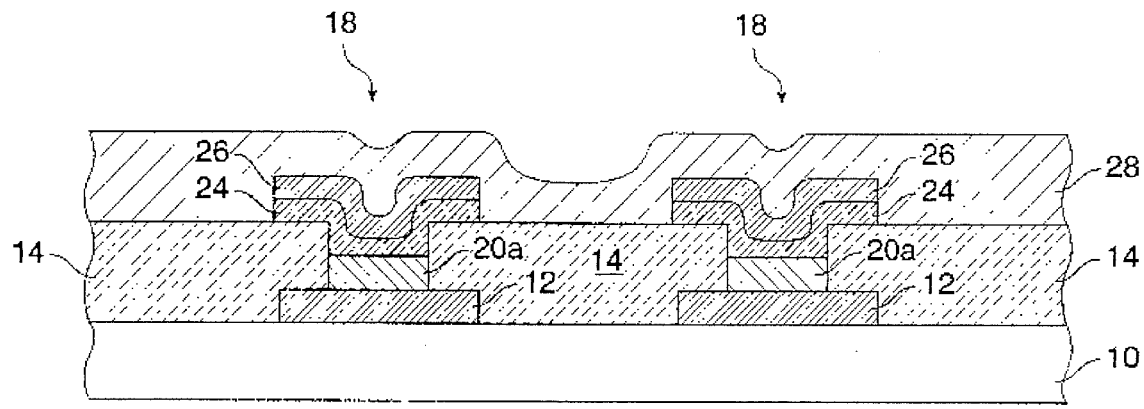
FIG. 10 is a diagram showing the completed metal-to-metal antifuse structure according to the present invention.

Next, as shown in FIG. 9, the antifuse cells are patterned and finally, as shown in FIG. 10, top electrode metallization layer 28 is formed over second barrier layer 26.

The benefits of this novel structure include its full compatibility with existing standard CMOS processes and particularly its compatibility with the standard CMOS metallization and planarization. Fuse capacitance is significantly reduced by the relatively smaller size of the first barrier metal layer versus the much larger size of the bottom electrode. Better step coverage is possible through the improved conformality for the antifuse material layer provided by the structure because the effective antifuse via depth is shallower due to the presence of the first barrier metal layer 20a within antifuse cell openings 18. Finally, a wide choice of barrier metals are available since the structure described imposes less restriction on the choice of a barrier material.

Figure 11:
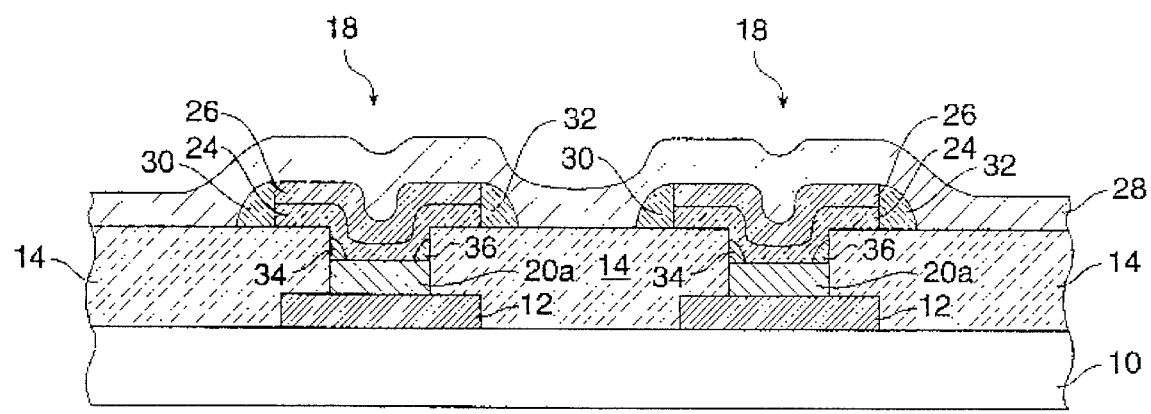
FIG. 11 is a diagram showing an alternative embodiment of the completed metal-to-metal antifuse structure according to the present invention.

According to an alternative embodiment of the present invention depicted in FIG. 11, spacers 30, 32, 34 and 36 may be added to further improve the performance of the structure as follows. Spacers 34 and 36 improve the ability of antifuse material layer 24 to conform to the shape of the bottom of antifuse cell opening 18. Spacers 30 and 32 help to isolate the aluminum in layer 28 from antifuse material layer 24 thus reducing side diffusion. Spacers 30, 32, 34 and 36 may all be constructed of silicon oxide, silicon nitride and/or amorphous silicon as is well known to those of ordinary skill in the art.

Spacers 34 and 36 reduce the capacitance of the antifuse cell because they reduce the exposed area of bottom barrier metal layer 20a.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse structure disposed over an insulating portion of a semiconductor substrate comprising:

a bottom electrode including an upper surface;

an interlayer dielectric layer disposed over said bottom electrode;

an antifuse cell opening in and through said interlayer dielectric layer and exposing said upper surface of said bottom electrode;

a first barrier metal layer disposed entirely within said antifuse cell opening and over and in physical and electrical contact with said bottom electrode, said first barrier metal layer being flat and of uniform thickness;

an antifuse material layer disposed over said interlayer dielectric layer, in said antifuse cell opening and over said first barrier metal layer;

a second barrier metal layer disposed over said antifuse material layer; and a top electrode disposed over and in electrical and physical contact with said second barrier metal layer.

2. An antifuse according to claim 1 wherein said antifuse material layer includes a first nitride layer, an amorphous silicon layer disposed over said first nitride layer, and a second nitride layer disposed over said amorphous silicon layer.

3. An antifuse structure comprising:

a bottom electrode including an upper surface;

an interlayer dielectric layer disposed over said bottom electrode;

an antifuse cell opening in and through said interlayer dielectric layer and exposing said upper surface of said bottom electrode;

a first barrier metal layer disposed entirely within said antifuse cell opening and over and in physical and electrical contact with said bottom electrode, said first barrier metal layer being flat and of uniform thickness;

an antifuse material layer disposed over said first barrier metal layer;

a second barrier metal layer disposed over said antifuse material layer; and a top electrode disposed over and in electrical and physical contact with said second barrier metal layer.

4. An antifuse according to claim 3 wherein said antifuse material layer includes a first nitride layer, an amorphous silicon layer disposed over said first nitride layer, and a second nitride layer disposed over said amorphous silicon layer.

* * * * *

UNITED STATES PATENT AND TRADEMARK OFFICE
CERTIFICATE OF CORRECTION

PATENT NO. : 5,543,656
DATED : August 6, 1996
INVENTOR(S) : Yoeuchung Yen; Shih-Oh Chen It is certified that error appears in the above-indentified patent and that said Letters Patent is hereby corrected as shown below:

On Column 3, line 25, replace "giagram" with --diagram--.

Figure 12:
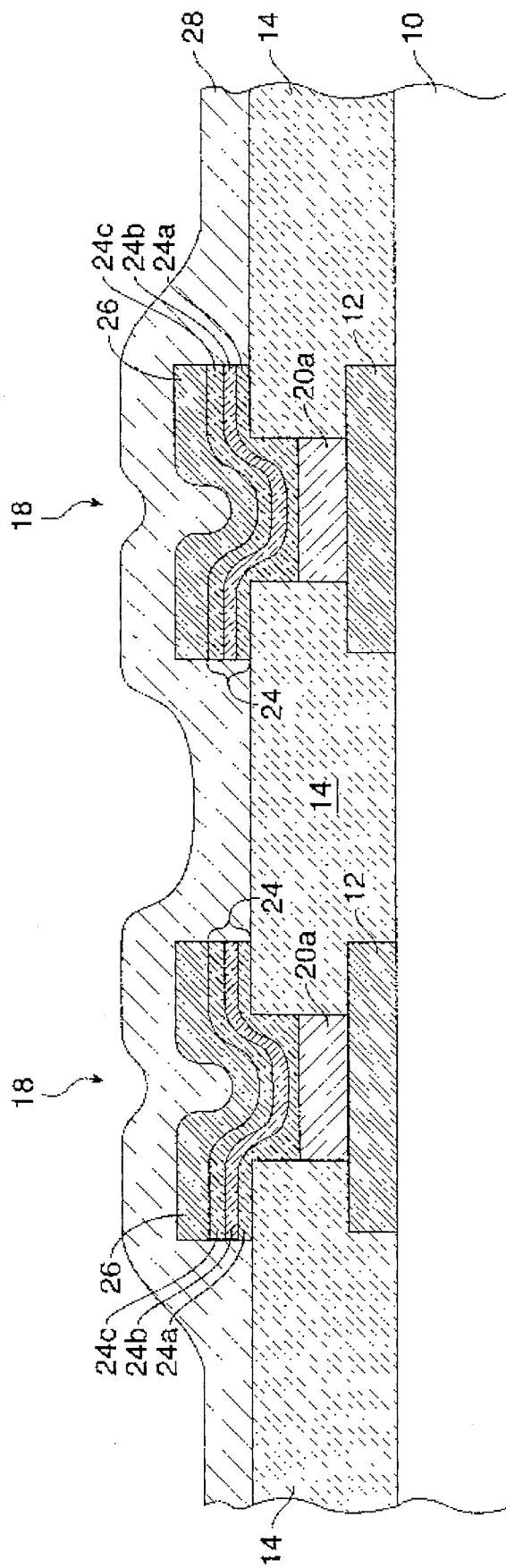
FIG. 12 is a giagram showing the three-layer antifuse embodiment according to a preferred embodiment of the present invention.

On Column 4, line 19, after "layer" insert --24a in FIG. 12--.

On Column 4, line 21, after "layer" insert --24b in FIG. 12--.

On Column 4, line 23, after "layer" insert --24c in FIG. 12--.

Signed and Sealed this

Fifteenth Day of April, 1997

*Attest:*

BRUCE LEHMAN

*Attesting Officer*  *Commissioner of Patents and Trademarks*